(12) United States Patent
Lee et al.

(10) Patent No.: US 7,773,078 B2
(45) Date of Patent: Aug. 10, 2010

(54) INFORMATION DETECTION DEVICE AND INFORMATION DETECTION DISPLAY DEVICE

(75) Inventors: Joo-Hyung Lee, Gyeonggi-do (KR); Young-Jun Choi, Gyeonggi-do (KR); Sang-Jin Pak, Gyeonggi-do (KR); Kee-Han Uh, Gyeonggi-do (KR); Jong-Woung Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 927 days.

(21) Appl. No.: 11/231,429

(22) Filed: Sep. 20, 2005

(65) Prior Publication Data

US 2006/0060752 A1    Mar. 23, 2006

(30) Foreign Application Priority Data

Sep. 21, 2004    (KR) ............... 10-2004-0075468

(51) Int. Cl.
*G09G 5/00* (2006.01)
(52) U.S. Cl. ........................................ 345/207; 345/81
(58) Field of Classification Search ................ 345/207, 345/81, 98–100, 175, 173; 349/12; 178/18.09, 178/18.03
See application file for complete search history.

(56) References Cited

U.S. PATENT DOCUMENTS

| | | | |
|---|---|---|---|
| 4,816,819 A * | 3/1989 | Enari et al. .................. 345/211 |
| 5,119,183 A * | 6/1992 | Weisfield et al. ............ 358/505 |
| 5,194,862 A * | 3/1993 | Edwards ........................ 341/20 |
| 5,495,347 A * | 2/1996 | Kim ............................. 358/483 |
| 6,028,581 A * | 2/2000 | Umeya ......................... 345/104 |
| 6,320,568 B1 * | 11/2001 | Zavracky ..................... 345/101 |
| 6,583,439 B2 * | 6/2003 | Yamazaki et al. .............. 257/59 |
| 6,720,942 B2 * | 4/2004 | Lee et al. ....................... 345/82 |
| 7,173,607 B2 * | 2/2007 | Matsumoto et al. ......... 345/173 |
| 7,242,449 B1 * | 7/2007 | Yamazaki et al. ........... 349/116 |
| 7,349,574 B1 * | 3/2008 | Sodini et al. ................. 382/168 |
| 2005/0052435 A1 * | 3/2005 | Cho et al. .................... 345/182 |
| 2006/0033729 A1 * | 2/2006 | Yoshida et al. .............. 345/207 |

FOREIGN PATENT DOCUMENTS

| | | |
|---|---|---|
| CN | 1055634 A | 10/1991 |
| CN | 1373450 A | 10/2002 |
| CN | 1447592 A | 10/2003 |
| EP | 1367839 A1 | 12/2003 |
| JP | 2004-005685 A | 1/2004 |

\* cited by examiner

*Primary Examiner*—Amare Mengistu
*Assistant Examiner*—Dmitriy Bolotin
(74) *Attorney, Agent, or Firm*—Innovation Counsel LLP

(57) ABSTRACT

An information detection device according to an embodiment of the present invention includes: light sensing units generating photocurrents according to light amount and outputting sensor data signals based on the photocurrent; sensor scanning lines receiving sensor scanning signals from a sensor scanning driver and controlling the output of the sensor data signals from the light sensing units; sensor data lines transmitting the sensor data signals from the light sensing units; and a sensing signal processor receiving the sensor data signals from the sensor data lines at input terminals, wherein the number of the input terminals of the sensing signal processor is less than the number of the sensor data lines.

12 Claims, 11 Drawing Sheets

INFORMATION DETECTION DEVICE AND INFORMATION DETECTION DISPLAY DEVICE

BACKGROUND OF THE INVENTION (a) Field of the Invention

The present invention relates to an information detection device and an information detection display device, and in particular, to an information detection device and an information detection display device including a light sensor.

(b) Description of Related Art

A device for detecting position information or touch information of a selected position in a predetermined area detects the information using a detection of a resistance value or light variation. The former includes a plurality of resistive lines disposed on lower and upper substrates and extending vertically or horizontally. The resistive lines contact each other by external stimulus and vary the resistance thereof. The device senses the variation of the resistance to find position information or touch information. In the light variation sensing system, light sensing units sensing the variation of an amount of light, or an amount of light having a predetermined wavelength is used to detect the position information or the touch information.

A device using the resistive method is usually formed on a transparent substrate and is easily combined with other display devices. A device using the variation of light or the variation of light having a predetermined wavelength usually includes light sensing units incorporated in a display device. The resistive method decreases the luminance of the display device and increases the thickness of the product, while the device using the variation of light having a predetermined wavelength requires an additional element for generating the light having the predetermined wavelength.

An information detection device and an information detection display device, which includes light sensing elements therein, but which requires no additional light generator, for obtaining position information and touch information from the variation of light is known. However, in the known device the output signals of the light sensing units vary depending on the deviation of characteristics of the light sensing units and depending on the wavelength of incident light. Furthermore, the light sensing units incorporated in the display device may also be affected by other elements in the display device. For example, the foregoing problems occur in display devices which include amorphous silicon as an information detection device. Since the display device can form both of thin film transistors and light sensing units using amorphous silicon, the incorporation of the light sensing units into the display device is easy. However, the light sensing units have characteristic variation due to the amorphous phase and thus they output signals different from each other for the same stimulus. In addition, when the light sensing units are disposed under color filter layers according to the characteristics of the display device, the light sensing units may receive different-color lights. When the light sensing units are sensitive to a predetermined wavelength range, the outputs of the light sensing units may be different depending on the colors represented by the color filter layers. In addition, the light sensing units may be affected by image data signals for displaying images such that the light sensing units output distorted signals.

SUMMARY OF THE INVENTION

An information detection device according to an embodiment of the present invention includes: light sensing units generating photocurrents according to light amount and outputting sensor data signals based on the photocurrent; sensor scanning lines receiving sensor scanning signals from a sensor scanning driver and controlling the output of the sensor data signals from the light sensing units; sensor data lines transmitting the sensor data signals from the light sensing units; and a sensing signal processor receiving the sensor data signals from the sensor data lines at input terminals, wherein the number of the input terminals of the sensing signal processor is less than the number of the sensor data lines.

An information detection device according to another embodiment of the present invention includes: light sensing units generating photocurrents according to light amount and outputting sensor data signals based on the photocurrent; sensor scanning lines transmitting sensor scanning signals to control the output of the sensor data signals from the light sensing units; a sensor scanning driver transmitting the sensor scanning signals to the sensor scanning lines through output terminals, the number of the output terminals being smaller than the number of the sensor scanning lines; sensor data lines the sensor data signals outputted from the light sensing units; and a sensing signal processor receiving the sensor data signals from the sensor data lines and processing the received sensor data signals.

An information detection display device according to an embodiment of the present invention includes a first substrate, a second substrate facing the first substrate, and a liquid crystal layer interposed between the first substrate and the second substrate. On the first substrate, image scanning lines, image data lines, thin film transistors electrically connected to the image scanning lines and the image data lines, and pixel electrodes disposed in areas defined by the image scanning lines and the image data lines and electrically connected to the thin film transistors are formed. Color filter stripes and a common electrode are formed on the second substrate. The color filter stripes are disposed on area corresponding to the pixel electrodes. The color filter stripes include red color filter stripes, green color filter stripes, and blue color filter stripes. The information detection display device further includes: light sensing units disposed in areas defined by the image scanning lines and the image data lines on the first substrate, disposed under the pixel electrodes, generating photocurrents according to light amount, and outputting sensor data signals based on the photocurrent; sensor scanning lines disposed on the first substrate, and receiving sensor scanning signals from a sensor scanning driver and controlling the output of the sensor data signals from the light sensing units; sensor data lines that are disposed on the first substrate, add the sensor data signals outputted from different light sensing units disposed under at least one of the red color filter stripes, at least one of the green color filter stripes, and at least one of the blue color filter stripes, and transmit the added sensor data signals to the sensing signal processor; and a sensing signal processor receiving the sensor data signals from the sensor data lines and processing the received sensor data signals.

At least one of the sensor data lines may adds the sensor data signals outputted from at least two different light sensing units and transmits the added sensor data signals to the sensing signal processor when one of the sensor scanning lines is supplied with a scanning signal.

An exemplary light sensing unit includes: a sensing element generating photocurrents according to light amount; and a switching element outputting the sensor data signals in response to a sensor scanning signal. The sensing element may include amorphous silicon that responds to light to generate photocurrent. In detail, the sensing element includes a thin film transistor that includes amorphous silicon as a channel layer and has a structure that allows incident light into the channel layer. The switching element may include a thin film transistor. The light sensing unit may further include a sensing capacitor connected between the sensing element and the switching element and storing electric charges corresponding to the photocurrent to maintain a predetermined voltage.

The number of the sensor scanning lines may be larger than the number of the sensor scanning signals supplied from the sensor scanning driver such that at least two of the sensor scanning lines simultaneously receive a single scanning signal. For this purpose, some of the sensor scanning lines are electrically connected to each other. For example, in the information detection display device, when a single gray of a single color is displayed along one of image data lines, and image data signals sequentially applied to the one of the image data lines give different voltages to adjacent pixel electrodes, the sensor scanning lines that are connected to the light sensing units disposed under the adjacent pixel electrodes are electrically connected to each other such that the light sensing units disposed under the adjacent pixel electrodes output the sensor data signals to the sensor data lines to be added the information detection display device.

The information detection device and the information detection display device may further include driving voltage lines electrically connected to the light sensing units. The driving voltage lines for the light sensing units are disposed between the image data signal lines and the sensor data lines adjacent to the image data signal lines in areas defined by the image scanning lines and the image data lines. The driving voltage lines may be supplied with a DC voltage. The driving voltage lines may be electrically connected to the light sensing units and the image scanning lines.

In the information detection display device, the sensor scanning lines may be image scanning lines, and the sensor scanning driver may be an image scanning driver. That is, the image scanning lines may be connected to the switching elements of the light sensing units. When the driving voltage lines are electrically connected to the light sensing units and the image scanning lines, a switching element of a light sensing unit is electrically connected to an image scanning line separated from the driving voltage lines.

The pixel electrodes may include transparent electrodes and opaque electrodes. The light sensing units may be disposed under the opaque electrodes, and the opaque electrodes may have openings to allow incident light to reach the light sensing units.

The information detection display device may be one of a liquid crystal display and organic light emitting diode display.

BRIEF DESCRIPTION OF THE DRAWINGS

The present invention will be appreciated by reference to the following explanation of the embodiments in conjunction with the accompanying drawings in which.

DETAILED DESCRIPTION OF EMBODIMENTS

Figure 1:
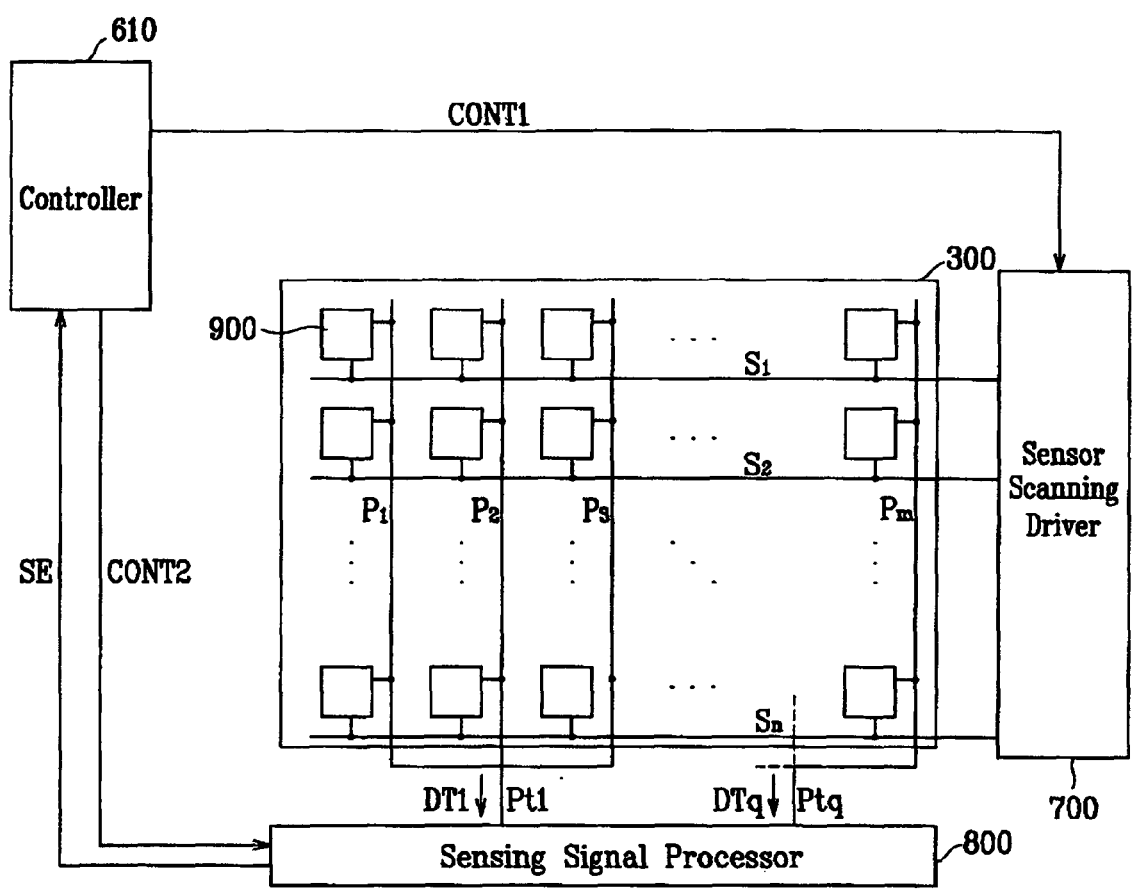
FIG. 1 is a block diagram of an information detection device according to an embodiment of the present invention.

The present invention is described below with reference to the accompanying drawings, in which preferred embodiments of the invention are shown.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

FIG. 1 is a block diagram of an information detection device according to an embodiment of the present invention.

Referring to FIG. 1, the information detection device according to an embodiment of the present invention includes a plurality of light sensing units 900, a sensor scanning driver 700, a sensing signal processor 800, and a controller 610 controlling the above elements.

The light sensing units 900 are disposed on a substrate and arranged in a matrix. A plurality of signal lines $S_1$-$S_n$ and $P_1$-$P_m$ transmit signals for the light sensing units 900 are also disposed on the substrate 300.

The signal lines $S_1$-$S_n$ and $P_1$-$P_m$ include: a plurality of sensor scanning lines $S_1$-$S_n$ which carry sensor scanning signals from the sensor scanning driver 700 to the light sensing units 900; and a plurality of sensor data lines $P_1$-$P_m$ which carry sensor data signals from the light sensing units 900 to the sensing signal processor 800. The sensor scanning lines $S_1$-$S_n$ extend substantially in a row direction and are substantially parallel to each other, while the image data lines $D_1$-$D_m$ (shown in FIGS. 3 and 4) and the sensor data lines $P_1$-$P_m$ extend substantially in a column direction and are substantially parallel to each other. The sensor data lines $P_1$-$P_m$ form a plurality of the sensor data signal line groups, and the sensor data lines $P_1$-$P_m$ of each sensor data signal line group are connected to each other through interconnections Pt1-Ptq. The light sensing units 900 form a plurality of light sensor groups based on the connection to the sensor data signal line groups. More particularly, the light sensing units shown in FIG. 1 form light sensor groups that are coupled to light sensor group data line PT1. Similarly, the light sensing units in a different light sensing group are coupled to a different light sensor group data line.

In the information detection device, the light sensing units 900 generate sensor data signals in response to the sensor scanning signals and supply the sensor data signals to the sensing signal processor 800 through the sensor data lines $P_1$-$P_m$ and the group interconnections Pt1-Ptq. Thus, the sensor data signals that are provided from the light sensing units 900 in a light sensor group are commonly connected via the interconnections Pt1-Ptq to be input into the sensing signal processor 800.

The sensing signal processor 800 generates a light detection signal SE based on the sensor data signals DT1-DTq from the interconnections Pt1-Ptq.

The controller 610 controls the sensor scanning driver 700 and the sensing signal processor 800, and determines the positions of external stimulus, based on the light detection signal SE from the sensing signal processor 800. More particularly, the controller 610 outputs control signals CONT1 to the sensor scanning driver 700 to control the output of the sensor scanning signals, and outputs the control signals CONT2 to the sensing signal processor 800 to perform some controls such as reset. Furthermore, the controller 610 determines the positions of external stimulus based on the generation positions of the sensor data signals DT1-DTq and the output positions of the sensor scanning signals, which are obtained from the light detection signal SE. The position determination may alternatively be performed by a separate processing device instead of the controller 610.

In this way, the information detection device according to this embodiment combines the sensor data signals outputted from several light sensing units 900, thereby reducing errors caused by the variation of the characteristics of the individual light sensing units 900. In particular, since the characteristic variation in the light sensing units 900 including amorphous silicon is significant, this embodiment can be desirably applied to the light sensing units 900 which include amorphous silicon.

Figure 2:
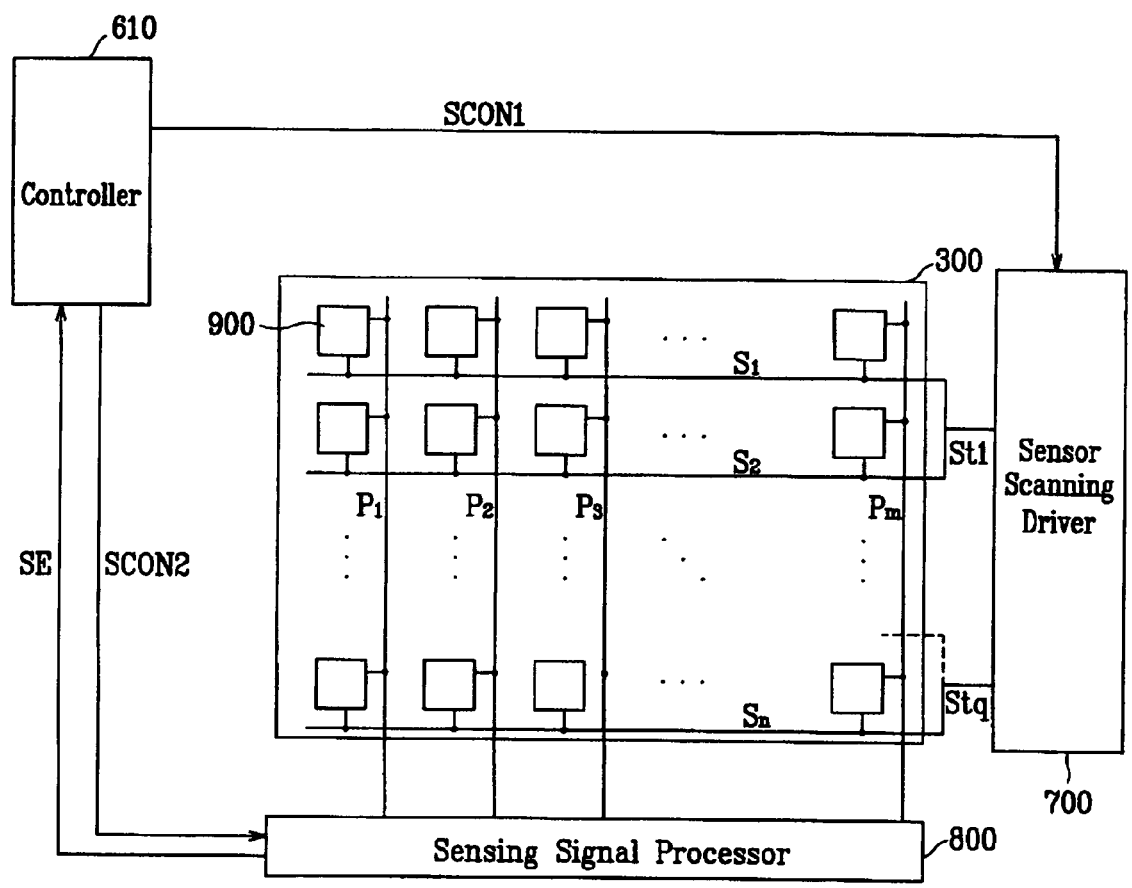
FIG. 2 is a block diagram of an information detection device according to another embodiment of the present invention.

FIG. 2 is a block diagram of an information detection device according to another embodiment of the present invention.

Like the information detection device shown in FIG. 1, the information detection device shown in FIG. 2 also includes a plurality of light sensing units 900, a sensor scanning driver 700, a sensing signal processor 800, and a controller 610. The information detection device also further includes a plurality of sensor scanning lines $S_1$-$S_n$ and a plurality of sensor data lines $P_1$-$P_m$.

In contrast to the information detection device shown in FIG. 1, the information detection device shown in FIG. 2 couples a pair of adjacent sensor scanning lines $S_1$-$S_n$ to sensor scanning driver 700 through output scanning connections St1-Stq to simultaneously provide the same scanning signal to the point of scanning lines. Therefore, the number of the sensor scanning lines $S_1$-$S_n$ is greater than the number of output terminals from the sensor scanning driver 700. Alternatively, three or more sensor scanning lines $S_1$-$S_n$ may be coupled to each other. In this embodiment, the sensor data lines $P_1$-$P_n$ are not coupled in common.

In this way, two or more light sensing units 900 connected to a sensor data line $P_1$-$P_n$ simultaneously output sensor data signals and the outputted sensor data signals overlap to be supplied to the sensing signal processor 800, thereby reducing errors caused by the variation of the characteristics of the light sensing units 900.

An information detection device according to another embodiment of the present invention may include both the interconnections Pt1-Ptq shown in FIG. 1 and the scanning connections St1-Str shown in FIG. 2. For example, see FIG. 4 for an embodiment of that type.

Display devices including information detection scheme shown in FIGS. 1 and 2 are described in more detail with reference to FIGS. 3 and 4.

Figure 3:
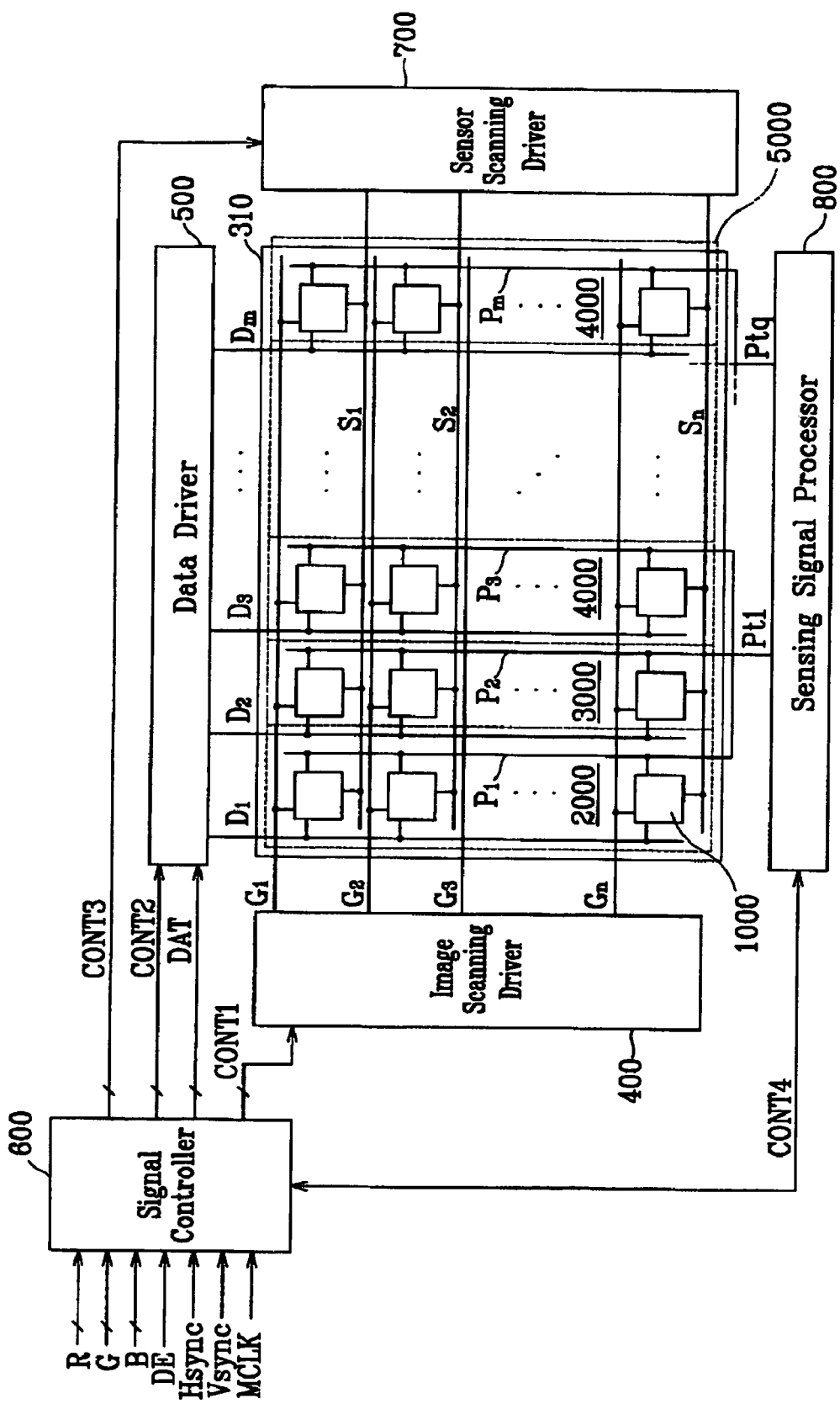
FIG. 3 is a block diagram of an information detection display device according to an embodiment of the present invention.

FIG. 3 is a block diagram of a display device including an information detection scheme shown in FIG. 1 according to an embodiment of the present invention.

Referring to FIG. 3, a information detection display device according to an embodiment of the present invention includes a plurality of pixel units 1000 including light sensing units, a image scanning driver 400, a data driver 500, a sensor scanning driver 700, a sensing signal processor 800, and a signal controller 600 controlling the above elements.

The pixel units 1000 are disposed on a substrate 310 and arranged in a matrix, and each of the pixel units 1000 includes a pixel electrode (not shown). A plurality of color filter stripes 5000 (not shown) are also disposed on the substrate 300 and extend in the column direction. In addition, a plurality of signal lines $G_1$-$G_n$, $D_1$-$D_m$, $S_1$-$S_n$ and $P_1$-$P_m$ for signal transmission of the light sensing units 900 are also provided on the substrate 300.

The signal lines $G_1$-$G_n$, $D_1$-$D_m$, $S_1$-$S_n$ and $P_1$-$P_m$ include a plurality of image scanning lines $G_1$-$G_n$ transmitting image scanning signals from the image scanning driver 400 to the pixel units 1000, a plurality of image data lines $D_1$-$D_m$ transmitting image data signals from the data driver 500 to the pixel units 1000, a plurality of sensor scanning lines $S_1$-$S_n$ transmitting sensor scanning signals from the sensor scanning driver 700 to the pixel units 1000, and a plurality of sensor data lines $P_1$-$P_m$ transmitting sensor data signals from the pixel units 1000 to the sensing signal processor 800. The image scanning lines $G_1$-$G_n$ and the sensor scanning lines $S_1$-$S_n$ extend substantially in a row direction and substantially parallel to each other, while the image data lines $D_1$-$D_m$ and the sensor data lines $P_1$-$P_m$ extend substantially in a column direction and substantially parallel to each other.

The configuration of the sensor scanning lines $S_1$-$S_n$, the sensor data lines $P_1$-$P_m$, the interconnections Pt1-Ptq, and the sensing signal processor 800 are substantially the same as those shown in FIG. 1.

The information detection operation of the information detection display device shown in FIG. 3 is substantially the same as that of the information detection display device shown in FIG. 1. However, it is noted that the controller 610 shown in FIG. 1 corresponds to the signal controller 600 shown in FIG. 3.

The signal controller 600 is supplied with input image signals R, G and B and input control signals for controlling the display thereof from an external graphics controller (not shown). The input control signals include a vertical synchronization signal Vsync, a horizontal synchronization signal Hsync, a main clock MCLK, and a data enable signal DE.

On the basis of the input control signals and the input image signals R, G and B, the signal controller 600 generates image scanning control signals CONT1, image data control signals CONT2, sensor scanning control signals CONT3, and sensor data control signals CONT4 and it processes the image signals R, G and B suitable for the operation of the display panel 300. The signal controller 600 sends the scanning control signals CONT1 to the image scanning driver 400, the processed image signals DAT and the data control signals CONT2 to the data driver 500, the sensor scanning control signals CONT3 to the sensor scanning driver 700, and the sensor data control signals CONT4 to the sensing signal processor 800.

The image scanning control signals CONT1 include an image scanning start signal STV for instructing to start image scanning and at least one clock signal for controlling the output time of the gate-on voltage Von. The image scanning control signals CONT1 may include an output enable signal OE for defining the duration of the gate-on voltage Von.

The image data control signals CONT2 include a horizontal synchronization start signal STH for informing of start of image data transmission for a group of pixel electrodes, a load signal LOAD for instructing to apply the image data signals to the image data lines $D_1$-$D_m$, and a data clock signal HCLK. The image data control signal CONT2 may further include an inversion signal RVS for reversing the polarity of the image data signals (with respect to the common voltage Vcom.

Responsive to the image data control signals CONT2 from the signal controller 600, the data driver 500 processes a packet of the digital image signals DAT for the group of pixel electrodes from the signal controller 600, converting the digital image signals DAT into analog image data signals selected from the gray voltages supplied from a gray voltage generator (not shown), and applies the analog image data signals to the image data lines $D_1$-$D_m$.

The image scanning driver 400 applies a gate-on voltage Von to an image scanning line $G_1$-$G_n$ in response to the image scanning control signals CONT1 from the signal controller 600, thereby turning on the switching transistors Qs1 connected thereto. The image data signals applied to the image data lines $D_1$-$D_m$ are then supplied to the pixel electrodes through the activated switching transistors Qs1.

The difference between the voltage of an image data signal and the common voltage Vcom is represented as a voltage across the liquid crystal (LC) capacitor Clc, which is referred to as a pixel voltage. The LC molecules in the LC capacitor Clc have orientations depending on the magnitude of the pixel voltage, and the molecular orientations determine the polarization of light passing through the LC layer 3. The polarizer(s) converts the light polarization into the light transmittance to display images.

By repeating this procedure by a unit of a horizontal period (also referred to as "1H" and equal to one period of the horizontal synchronization signal Hsync and the data enable signal DE), all image scanning lines $G_1$-$G_n$ are sequentially supplied with the gate-on voltage Von, thereby applying the image data signals to all pixel electrodes to display an image for a frame.

When the next frame starts after one frame finishes, the inversion control signal RVS applied to the data driver 500 is controlled such that the polarity of the image data signals is reversed (which is referred to as "frame inversion"). The inversion control signal RVS may be also controlled such that the polarity of the image data signals flowing in a data line are periodically reversed during one frame (for example, row inversion and dot inversion), or the polarity of the image data signals in one packet are reversed (for example, column inversion and dot inversion).

In this way, an information detection device and a display device can be combined to form an information detection display device.

In addition, when the pixel units 1000 including the light sensing units are disposed under the color filter stripes 5000 as shown in FIG. 3, a light having a wavelength defined by a color agent contained in the color filter stripes 5000 is incident on the light sensing units 900. If the light sensing units 900 are sensitive to a predetermined wavelength, the light sensing units 900 generate output signals depending on the colors represented by the color filter stripes 5000.

For example, it is assumed that reference numerals 2000, 3000 and 4000 in FIG. 3 denote red, green, and blue color filter stripes. Then, coupling the sensor data lines $P_1$, $P_2$ and $P_3$ connected to the pixel units 1000 disposed under different-color stripes 2000, 3000 and 4000 may reduce the errors in the output signals of the light sensing units 900 caused by different wavelengths of light.

Figure 4:
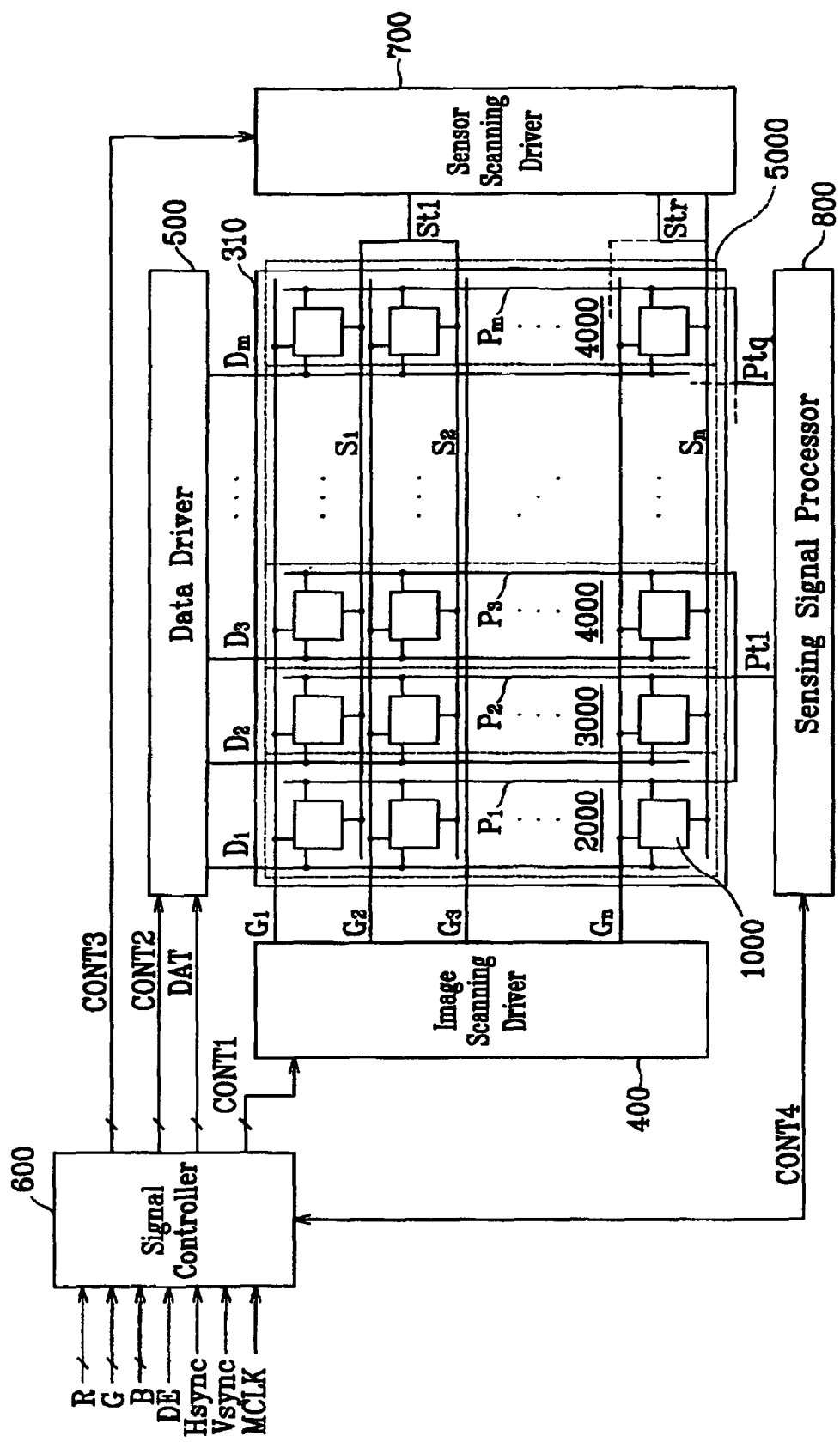
FIG. 4 is a block diagram of an information detection display device according to another embodiment of the present invention.

FIG. 4 is a block diagram of the information detection display device according to another embodiment of the present invention, which includes information detection scheme shown in FIGS. 1 and 2.

Like the information detection display device shown in FIG. 3, a information detection display device shown in FIG. 4 includes a plurality of pixel units 1000 including light sensing units, a image scanning driver 400, a data driver 500, a sensor scanning driver 700, a sensing signal processor 800, and a signal controller 600 controlling the above elements.

However, unlike the information detection display device shown in FIG. 3, the information detection device shown in FIG. 4 couples a pair of adjacent sensor scanning lines $S_1$-$S_n$ through scanning connections St1-Str to simultaneously receive the same scanning signal. Therefore, the number of the sensor scanning lines $S_1$-$S_n$ is greater than the number of output terminals of sensor scanning driver 700. Alternatively, three or more sensor scanning lines $S_1$-$S_n$ may be coupled to each other.

The information detection operation of the information detection display device shown in FIG. 4 is substantially the same as that described with reference to FIGS. 1 and 2, and the display operation of the information detection display device is substantially the same as that described with reference to FIG. 3.

Now, the structure of a pixel unit according to an embodiment of the present invention is described below in detail with reference to FIGS. 5-11.

Figure 5:
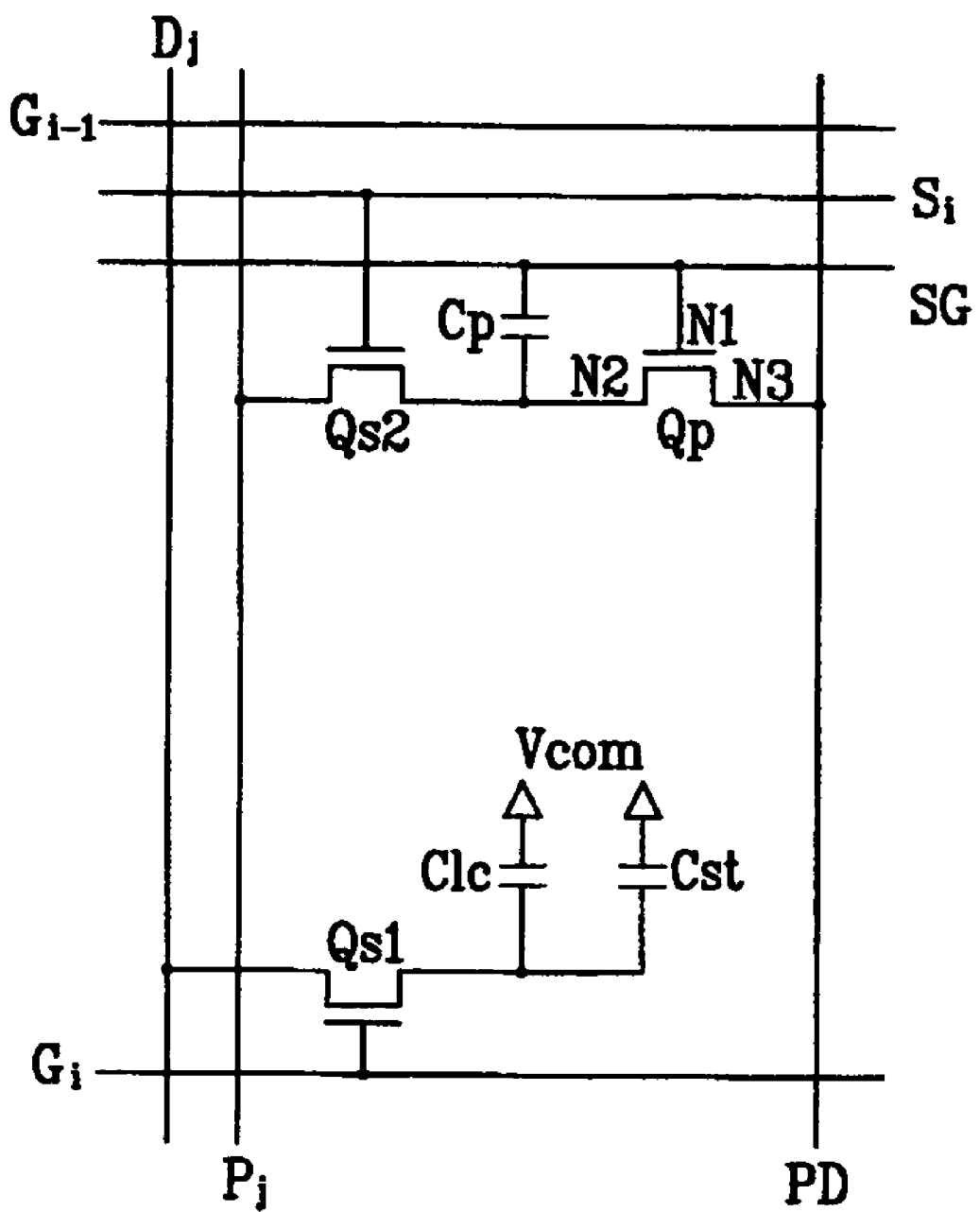
FIG. 5 is an equivalent circuit diagram of a pixel unit of an information detection display device according to an embodiment of the present invention.

FIG. 5 is an equivalent circuit diagram of a pixel unit of an information detection display device according to an embodiment of the present invention.

Referring to FIG. 5, each pixel unit (also referred to as "pixel" hereinafter), for example, a pixel unit in the i-th row (i=1, 2, . . . , n) and the j-th column (j=1, 2, . . . , m) includes a switching element Qs1 connected to an image scanning $G_i$ and an image data line $D_j$, and a LC capacitor Clc and a storage capacitor Cst that are connected to the switching element Qs1. Use of storage capacitor Cst is optional.

The switching element Qs1 such as a thin film transistor (TFT) has three terminals, i.e., a control terminal connected to the image scanning line $G_i$, an input terminal connected to the image data line $D_j$, and an output terminal connected to the LC capacitor Clc and the storage capacitor Cst.

The pixel further includes a light sensing unit, and the light sensing unit includes a sensing element Qp connected to signal lines SG and PD, a switching element Qs2 connected to signal lines $S_1$-$S_n$ and $P_1$-$P_m$, and a sensing capacitor Cp. Use of sensing capacitor Cp may be omitted.

The sensing element Qp has a control terminal N1 connected to a control voltage line SG, an output terminal N2 connected to the sensing capacitor Cp and the switching element Qs2, and an input terminal N3 connected to an input voltage line PD. The sensing capacitor Cp is connected between the output terminal N2 and the control terminal N1 of the sensing element Qp. The switching element Qs2 has a control terminal connected to a sensor scanning line $S_i$, an output terminal connected to a sensor data lines $P_j$, and an input terminal connected to the output terminal N2 of the sensing element Qp.

The sensing element Qp includes an amorphous silicon channel which generates photocurrent upon irradiation of light, and the generated photocurrent by a driving voltage in the input voltage line PD flow toward the sensing capacitor Cp and the switching element Qs2 or reverse. The sensing capacitor Cp stores an electrical charge, the amount of which is a function of the photocurrent and maintains a predetermined voltage.

The sensing capacitor Cp has a terminal connected to the control voltage line SG, which maintains a predetermined voltage for preventing the sensing element Qp from being affected by circumferential voltages.

The switching element Qs2 also has three terminals: a control terminal connected to a sensor scanning lines $S_i$ and a sensor data lines $P_j$. Upon application of a voltage to the sensor scanning line $S_i$ to turn on the switching element Qs2, the switching element Qs2 transmits a signal caused by the photocurrent or a voltage signal stored in the sensing capacitor Cp to the sensor data line $P_j$.

The switching elements Qs1 and Qs2 and the sensing element Qp may be TFTs including amorphous silicon as channel layers.

Figure 6:
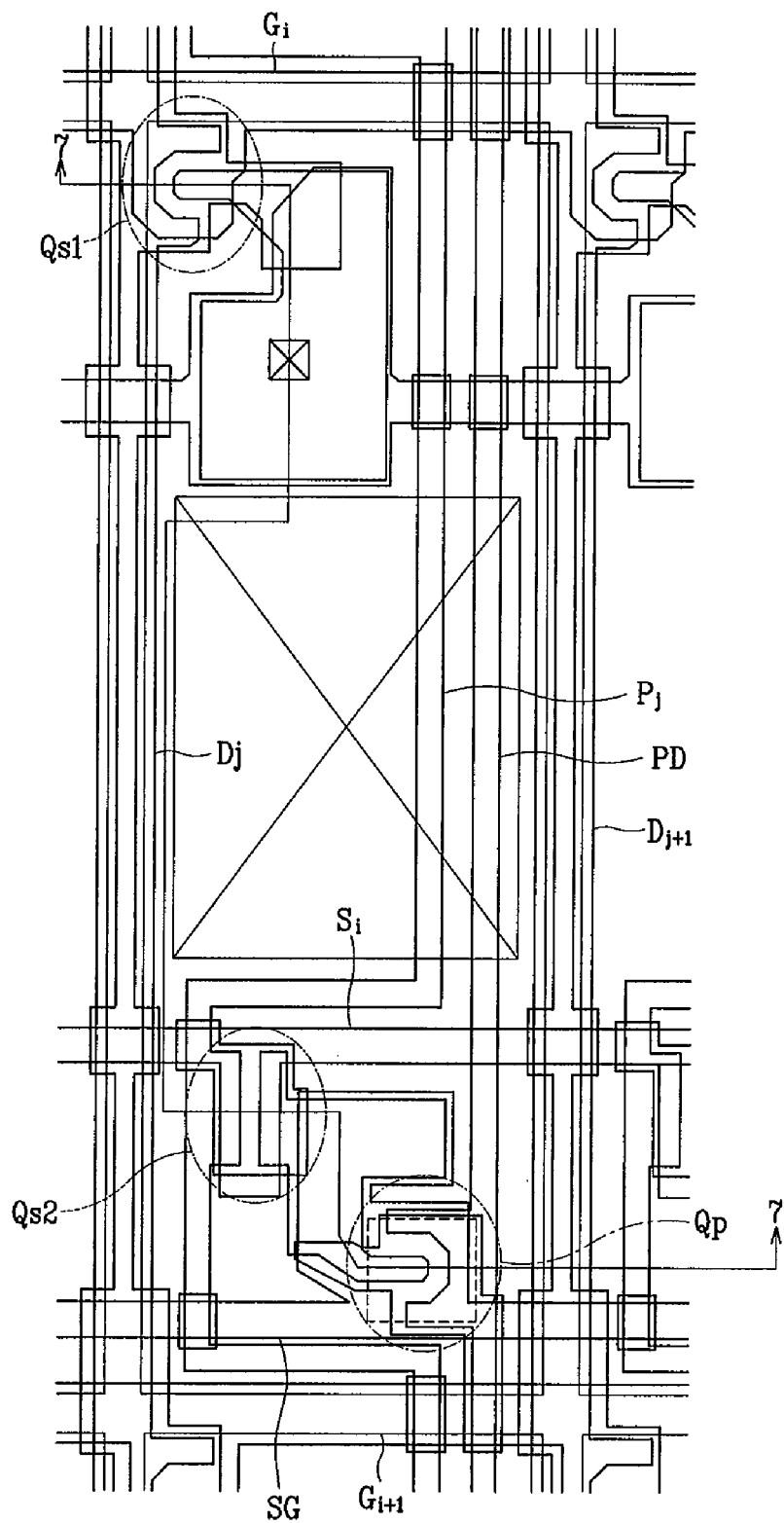
FIG. 6 shows an exemplary layout of a pixel unit shown in FIG. 5.

FIG. 6 shows an exemplary layout of a pixel unit shown in FIG. 5.

Signal lines $G_i$, $D_j$, SG, PD, $S_i$, $P_j$, switching elements Qs1 and Qs2, a liquid crystal capacitor Clc, a storage capacitor Cst, a sensing element Qp, a sensing capacitor Cp, etc., shown in FIG. 6 have functions the same as those described with reference to FIG. 1.

The input voltage line PD is disposed between the sensor data line $P_j$ and an image data line $D_{j+1}$, and it may be supplied with a predetermined voltage. Otherwise, the input voltage line PD may be electrically connected to the light sensing units and the image scanning lines. In particular, the input voltage line PD may be disposed at an area adjacent to the sensor data line $P_j$ and the image data lines $D_j$ and $D_{j+1}$, where the sensor data signals is apt to be affected by the image data signals, for example, due to the coupling between the sensor data signals and the image data signals.

Figure 7:
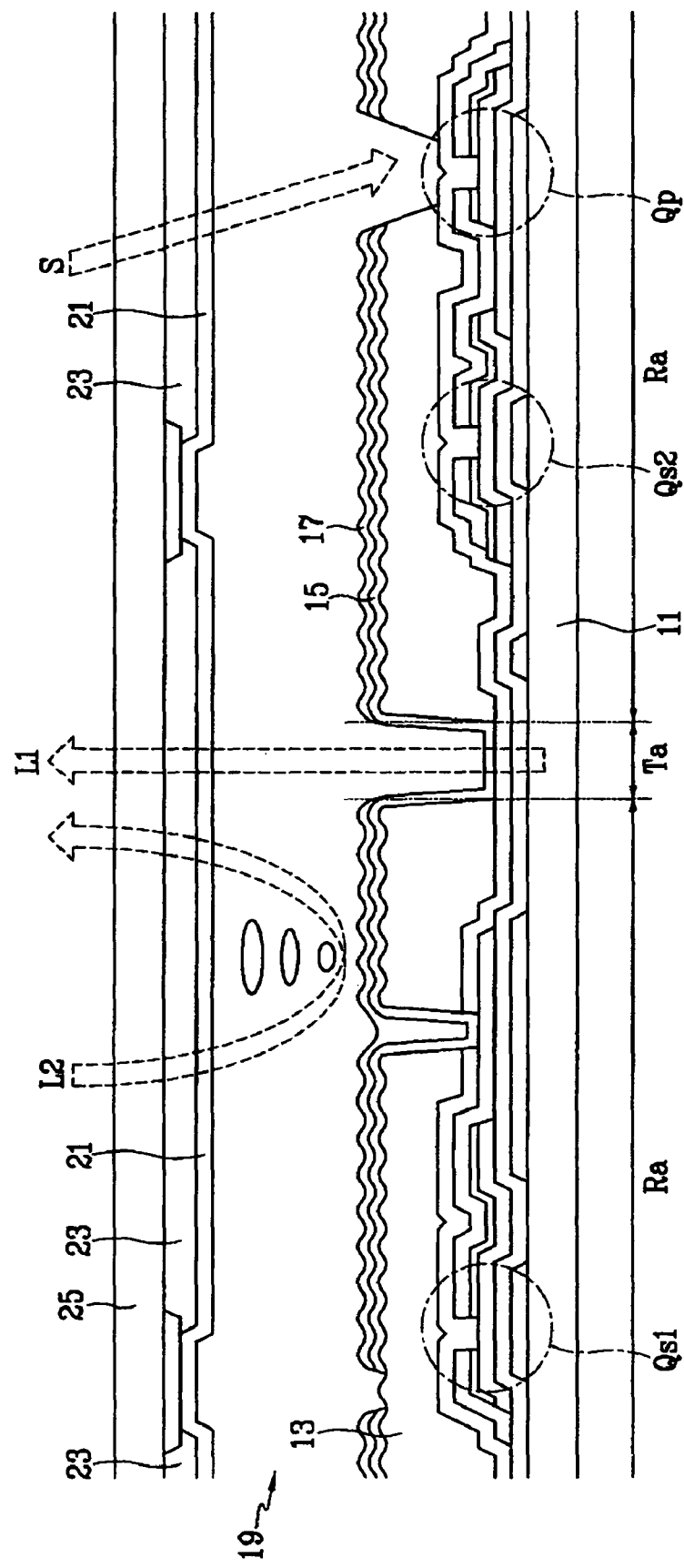
FIG. 7 is a sectional view of the pixel unit shown in FIG. 6 taken along line 7-7'.

FIG. 7 is a sectional view of the pixel unit shown in FIG. 6 taken along line 7-7.

The switching elements Qs1 and Qs2 and the sensing element Qp are disposed on a first substrate 11, and an organic insulating layer 13 is disposed on the switching elements Qs1 and Qs2. The organic insulating layer 13 includes a contact hole exposing a terminal electrode of the switching element Qs1, and an opening for transmitting light to a channel area of the sensing element Qp. A transparent electrode 15 and an opaque electrode 17 are disposed on the organic insulating layer 13 and the transparent electrode 15 and the opaque electrode 17 are electrically coupled to the exposed terminal electrode of the switching element Qs1. An area provided with the opaque electrode 17 is defined as a reflective area Ra, while an area provided only with the transparent electrode 15 is defined as a transmissive area Ta. The organic insulating layer 13 may have a thickness that is different between the transmissive area Ta and the reflective area Ra. The retardation defined as the multiplication of refractive anisotropy and the thickness of a liquid crystal layer in the transmissive area Ta may be equal to or twice the retardation in the reflective area Ra.

Color filter layers 23 and a common electrode 21 are disposed on an inner surface of a second substrate 25 facing the first substrate 11.

A liquid crystal layer 19 is interposed between the first substrate 11 and the second substrate 25.

FIGS. 8, 9, 10 and 11 are equivalent circuit diagrams of pixel units in information detection display devices according to other embodiments of the present invention.

Switching elements Qs1, liquid crystal capacitors Clc, storage capacitors Cst, sensing elements Qp, switching elements Qs2, and sensing capacitors Cp (that may be omitted) shown in FIGS. 8-11 are substantially the same as those shown in FIG. 5 and thus the detailed description thereof will be omitted. However, the differences such as connections therebetween will be described.

Figure 8:
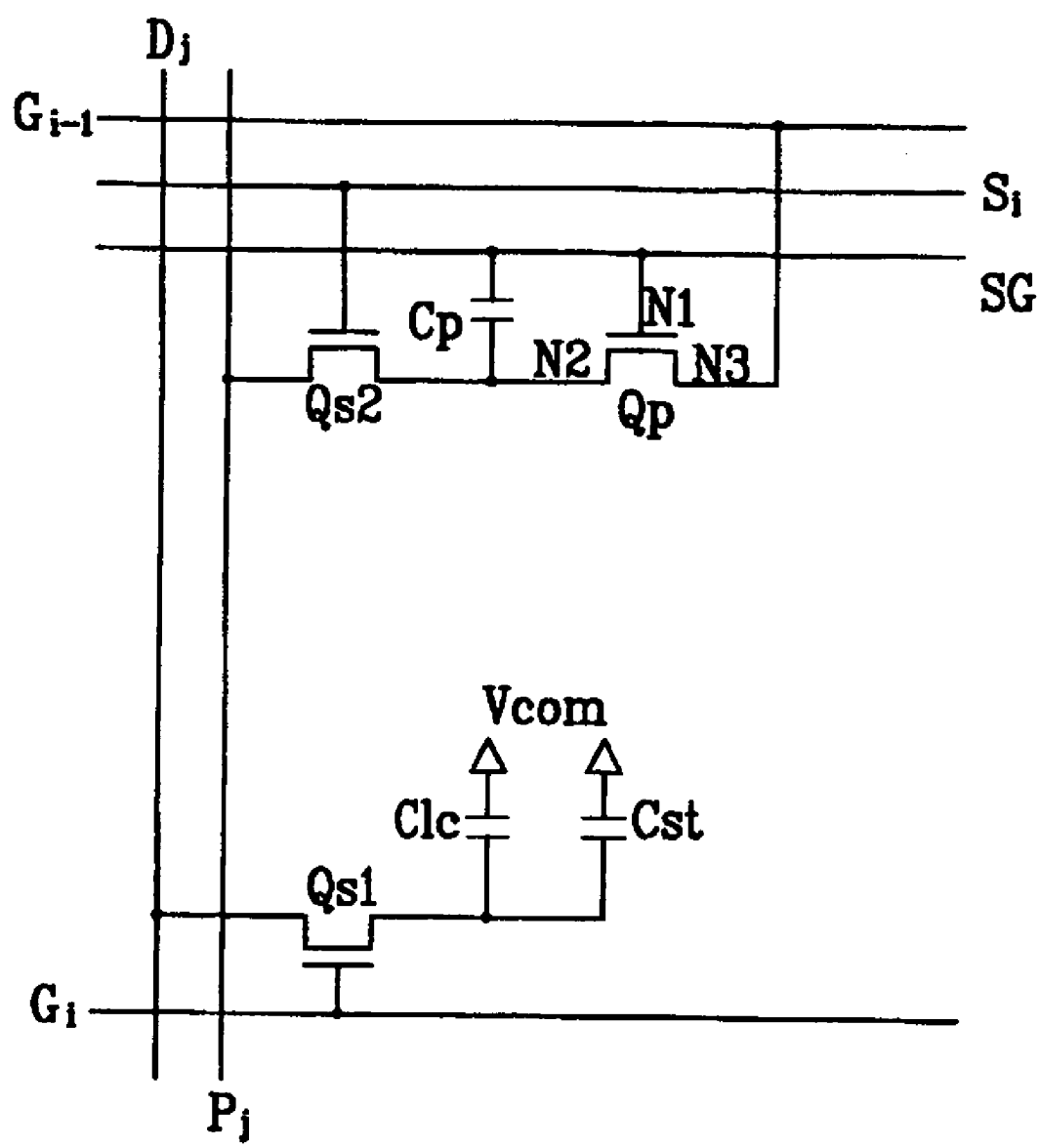
FIGS. 8, 9, 10 and 11 are equivalent circuit diagrams of pixel units in information detection display devices according to other embodiments of the present invention.

Referring to FIG. 8, the sensing element Qp has a control terminal N1 connected to a control voltage line SG, an output terminal N2 connected to the sensing capacitor Cp and the switching element Qs2, and an input terminal N3 connected to a previous image scanning line $G_{i-1}$. The sensing capacitor Cp is connected between the output terminal N2 and the control terminal N1 of the sensing element Qp. The switching element Qs2 has a control terminal connected to the sensor scanning line S1, an output terminal connected to the sensor data line $P_j$, and an input terminal connected to the output terminal N2 of the sensing element Qp.

Figure 9:
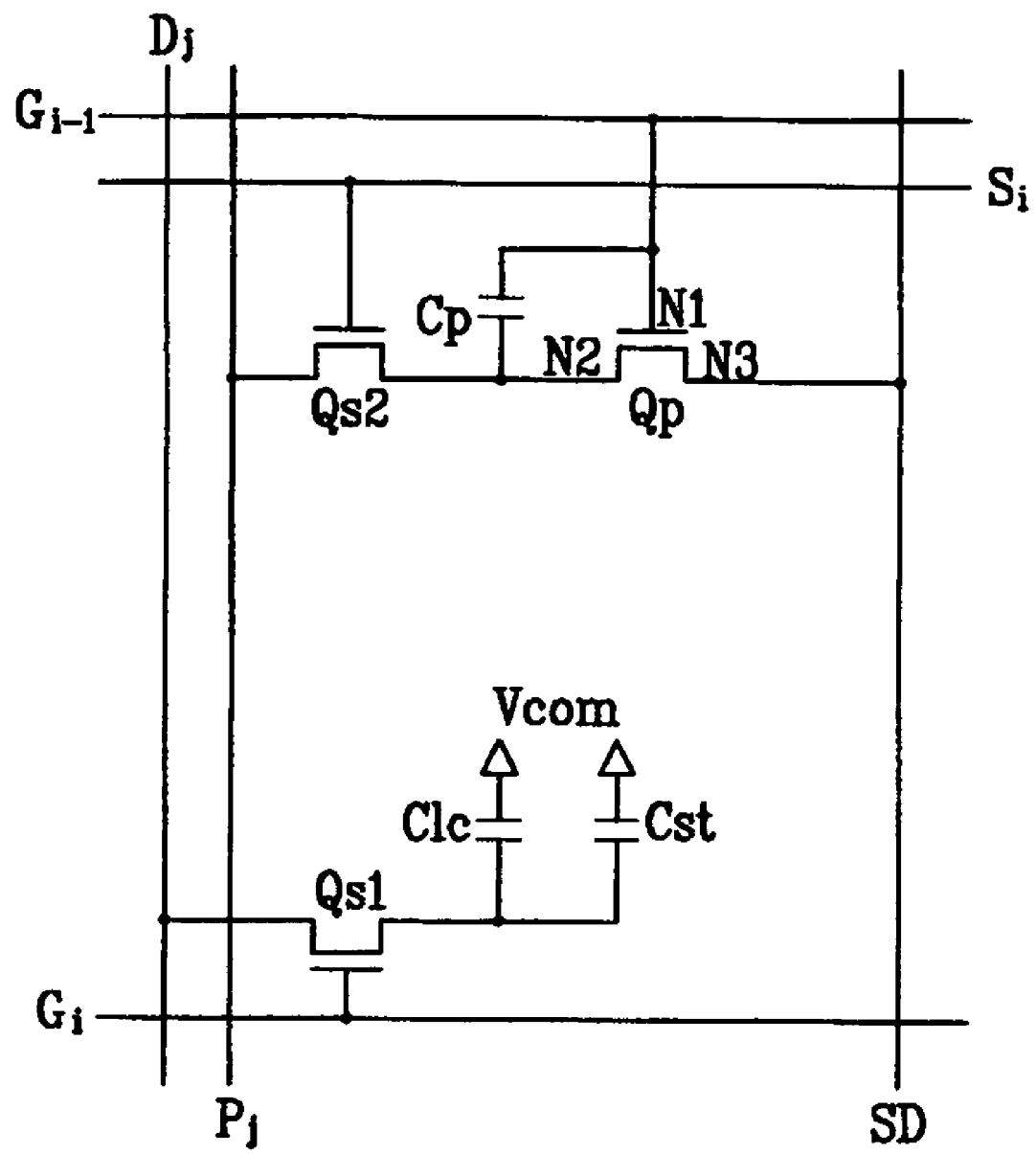

Referring to FIG. 9, the sensing element Qp has a control terminal N1 connected to a previous image scanning line $G_{i-1}$, an output terminal N2 connected to the sensing capacitor Cp and the switching element Qs2, and the input terminal N3 connected to an input voltage line SD. The sensing capacitor Cp is connected between the output terminal N2 and the control terminal N1 of the sensing element Qp. The switching element Qs2 has a control terminal connected to the sensor scanning line $S_i$, an output terminal connected to the sensor data line $P_j$, an input terminal connected to the output terminal N2 of the sensing element Qp.

Figure 10:
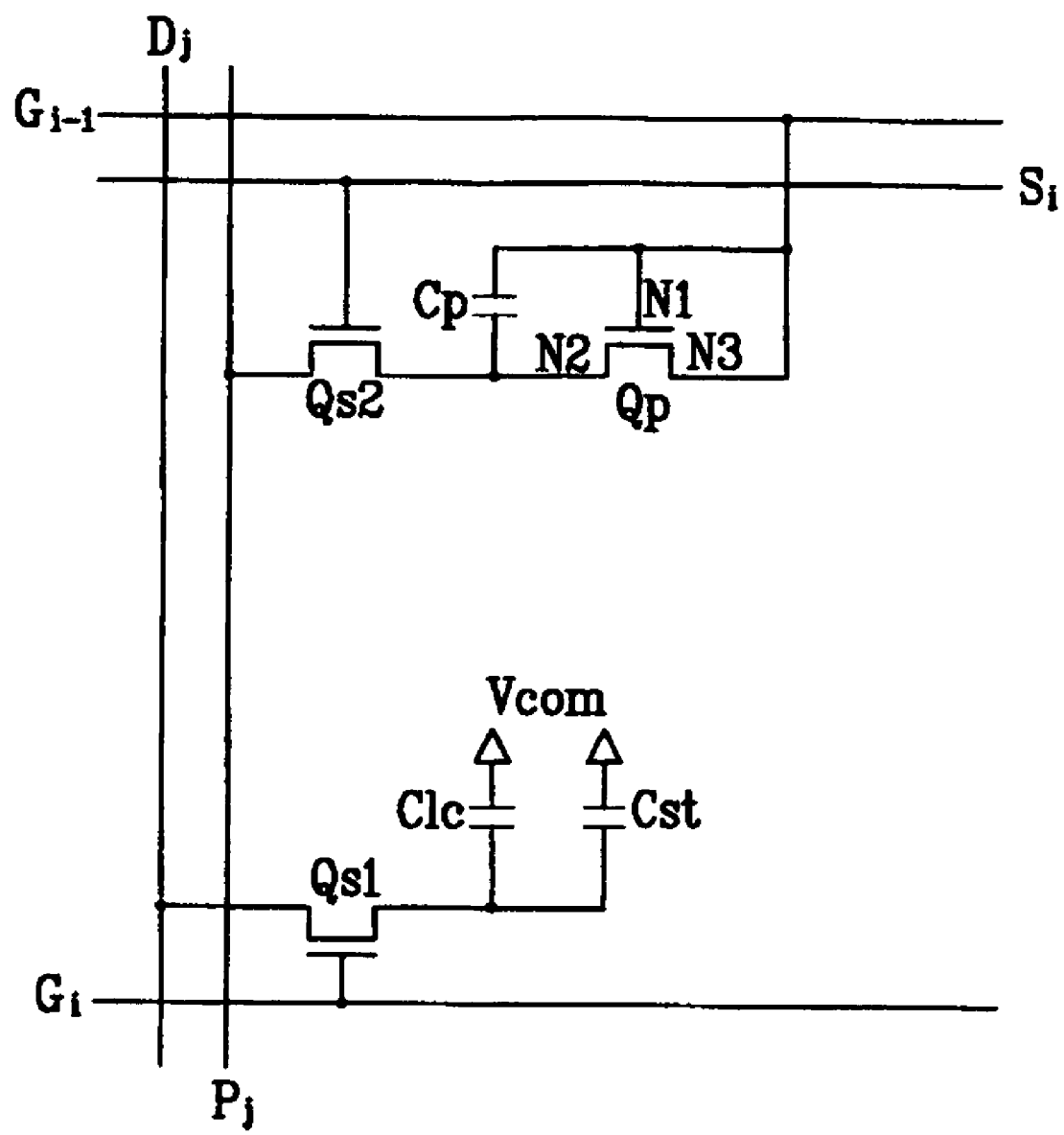

Referring to FIG. 10, the sensing element Qp has a control terminal N1 and an input terminal N3 commonly connected to a previous image scanning line $G_{i-1}$, and an output terminal N2 connected to the sensing capacitor Cp and the switching element Qs2. The sensing capacitor Cp is connected between the output terminal N2 and the control terminal N1 of the sensing element Qp. The switching element Qs2 has a control terminal connected to the sensor scanning line $S_i$, an output terminal connected to the sensor data line $P_j$, and an input terminal connected to the output terminal N2 of the sensing element Qp.

Figure 11:
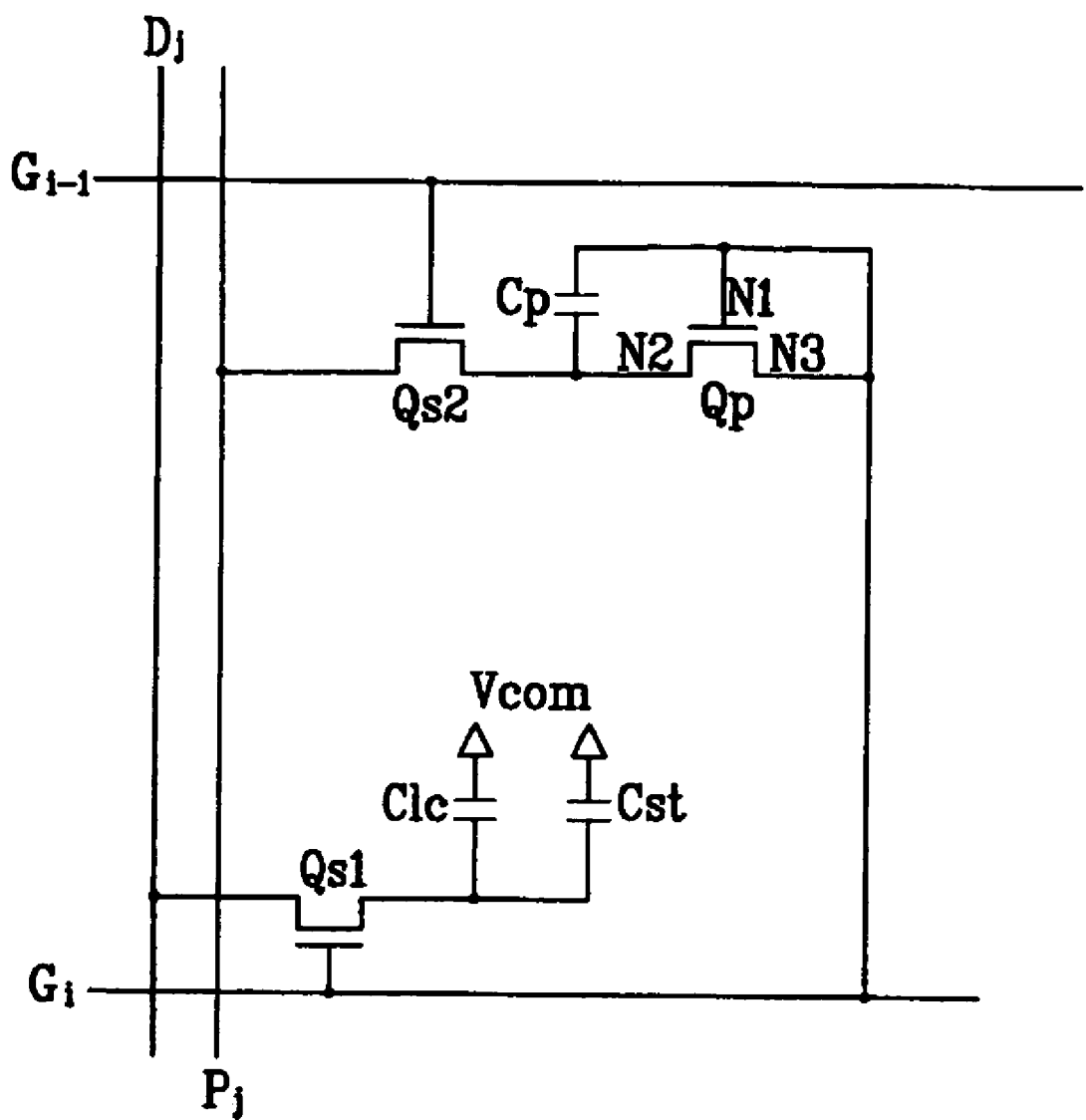

Referring to FIG. 11, the sensing element Qp has a control terminal N1 and the input terminal N3 commonly connected to an image scanning line $G_i$, an output terminal N2 connected to the sensing capacitor Cp and the switching element Qs2. The sensing capacitor Cp is connected between the output terminal N2 and the control terminal N1 of the sensing element Qp. The switching element Qs2 has a control terminal connected to a previous image scanning line $G_{i-1}$, an output terminal connected to the sensor data line $P_j$, and an input terminal connected to the output terminal N2 of the sensing element Qp.

The switching elements and the light sensing units in a pixel unit may have equivalent circuit diagrams shown in FIGS. 8-11, and may have a layout and a section shown in FIGS. 6 and 7.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:
1. An information detection display device comprising:
light sensing units disposed in areas defined by image scanning lines and image data lines on a first substrate and being disposed under pixel electrodes, the light sensing units being operative to generate a current in an amount which is a function of an amount of light impacting the light sensing units and output sensor data signals based on the current;

a sensor scanning driver providing sensor scanning signals;

sensor scanning line disposed on the first substrate, and coupled to the sensor scanning driver for receiving sensor scanning signals from the sensor scanning driver and controlling the output of the sensor data signals from the light sensing units;

a sensing signal processor;

at least three sensor data line disposed on the first substrate, each of the at least three sensor data lines coupled to one of the light sensing units so as to form a set of at lest three light sensing units, and the at lest three sensor data lines being coupled to each other, wherein the at lest three light sensing unit comprise a first light sensing unit disposed under at least one red color filter stripe, a second light sensing unit disposed under at least one green color filter stripe, and a third light sensing unit disposed under at least one blue color filter stripe to receive sensor data signals and transmit the sensor data signals to the sensing signal processor.

2. The information detection display device of claim 1, wherein the sensor scanning lines are image scanning lines, and the sensor scanning driver is an image scanning driver.

3. The information detection display device of claim 1, wherein each of the light sensing units comprises:

a sensing element including amorphous silicon and generating photocurrents according to light amount; and a switching element outputting the sensor data signals in response to a sensor scanning signal.

4. The information detection display device of claim 1, wherein the number of the sensor scanning lines is greater than the number of the sensor scanning signals supplied from the sensor scanning driver.

5. The information detection display device of claim 4, wherein at least two of the sensor scanning lines are electrically connected to simultaneously receive a scanning signal.

6. The information detection display device of claim 1, wherein driving voltage lines for the light sensing units are disposed between the image data signal lines and the sensor data lines adjacent to the image data signal lines in areas defined by the image scanning lines and the image data lines.

7. The information detection display device of claim 6, wherein the driving voltage lines are electrically connected to the light sensing units, and supplied with a DC voltage.

8. The information detection display device of claim 6, wherein the driving voltage lines are electrically connected to the light sensing units and the image scanning lines.

9. The information detection display device of claim 8, wherein the sensor scanning lines include image scanning lines that are separated from the driving voltage lines.

10. The information detection display device of claim 1, wherein when a single gray of a single color is displayed along one of the image data lines, and image data signals sequentially applied to the one of the image data lines give different voltages to adjacent pixel electrodes, the sensor scanning lines that are connected to the light sensing units disposed under the adjacent pixel electrodes are electrically connected to each other such that the light sensing units disposed under the adjacent pixel electrodes output the sensor data signals to the sensor data lines to be added by the information detection display device.

11. The information detection display device of claim 1, wherein the pixel electrodes comprise transparent electrodes and opaque electrodes.

12. The information detection display device of claim 11, wherein the light sensing units are disposed under the opaque electrodes, and the opaque electrodes have openings to allow incident light to reach the light sensing units.

* * * * *